US005926122A

United States Patent [19]
Dalton

[11] Patent Number: 5,926,122
[45] Date of Patent: Jul. 20, 1999

[54] ELECTRONIC CIRCUIT AND METHOD FOR SIMULATING MECHANICAL QUADRATURE ENCODERS

[75] Inventor: Ricky P. Dalton, Bremen, Ga.

[73] Assignee: Lucent Technologies Inc., Murray Hill, N.J.

[21] Appl. No.: 08/978,391

[22] Filed: Nov. 25, 1997

[51] Int. Cl.⁶ ............................................ H03M 1/00
[52] U.S. Cl. ................................... 341/117; 341/110
[58] Field of Search .................................. 341/117, 111, 341/112, 113, 114, 116, 110; 329/304; 375/328

[56] References Cited

U.S. PATENT DOCUMENTS 4,737,728   4/1988   Nakamura et al. ...................... 329/110

OTHER PUBLICATIONS

Parallax, Inc.; "Basic Stamp General Information"; Internet Data Sheet; WWW site last revised Sep. 10, 1997; 1 page.
Linear Technology, Inc.; "Micropower Sampling 12–Bit A/D Converters In S0–8 Packages"; Internet Data Sheet; Copyright 1996–1997; 1 page.
Maxim, Inc.; "+5V, Low–Power, Voltage–Output, Serial 12–Bit DACs"; Internet Data Sheet; Feb., 1997; 16 pages.
Analog Devices, Inc.; "Voltage–to–Frequency and Frequency–to–Voltage Converter"; Internet Data Sheet; Copyright 1995–1997; 6 pages.

*Primary Examiner*—Brian Young

[57] ABSTRACT

An electronic encoder circuit and method for providing a set of quadrature waveforms whose frequency is related to the amplitude of an analog input signal. Broadly stated, the electronic encoder circuit comprises conversion circuitry that generates a digital signal from an analog signal that, in a typical application, will be representative of the speed or frequency of a master machine, process or assembly line. The conversion circuitry is connected to a microcontroller that processes the digital signal and produces a potentially modified digital signal as an output. The output digital signal from the microcontroller is received by additional conversion circuitry that generates an encoded analog signal whose frequency is related to the original input analog signal. Phase shifting circuitry generates quadrature waveforms through operation on the encoded analog signal. The quadrature waveforms can then be used to drive or control a slave device.

30 Claims, 3 Drawing Sheets

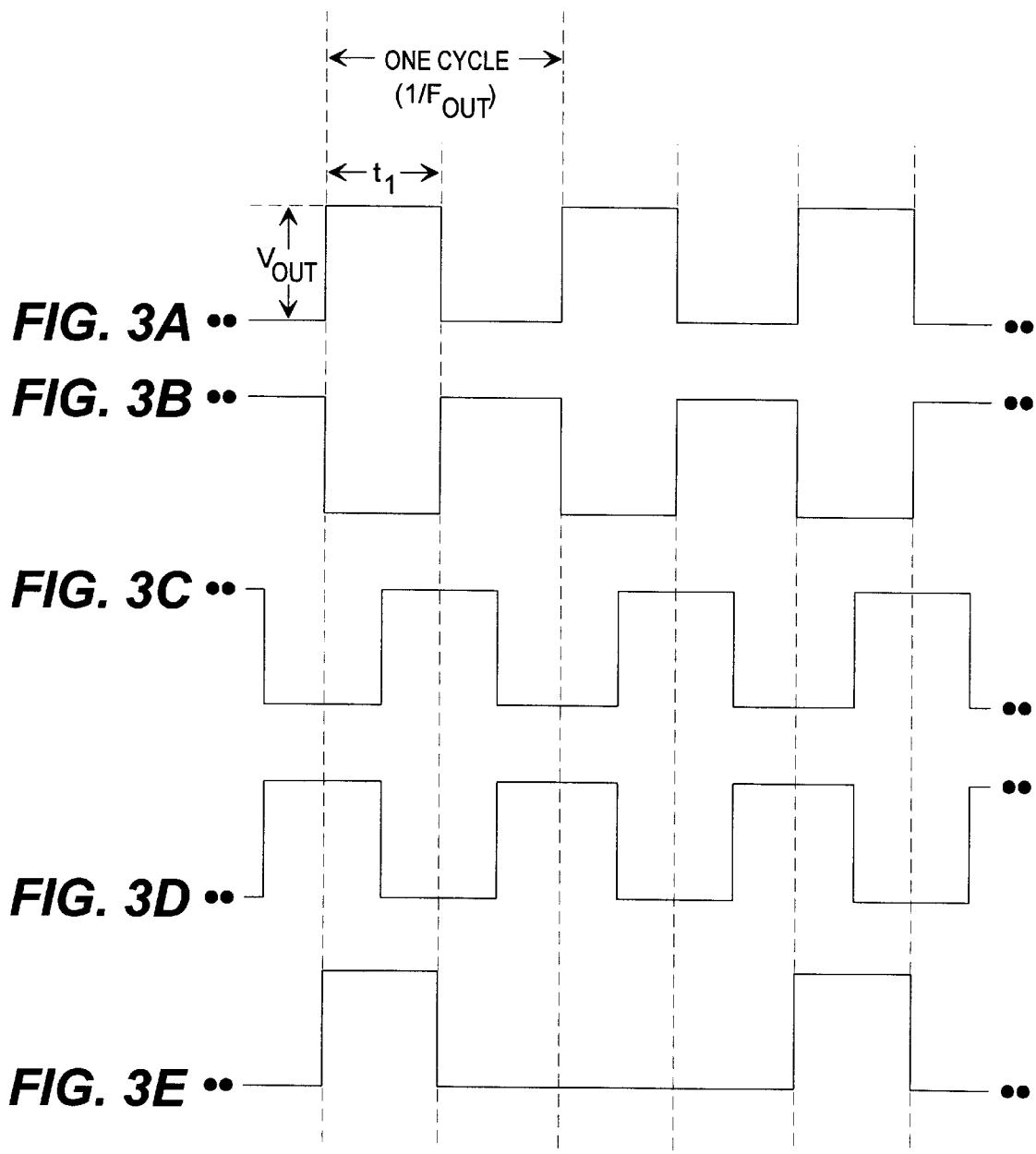

ELECTRONIC CIRCUIT AND METHOD FOR SIMULATING MECHANICAL QUADRATURE ENCODERS

BACKGROUND OF THE INVENTION

1. Field of the Invention

The present invention relates generally to the field of encoder apparatus, and more particularly to an electronic circuit that simulates a mechanical encoder.

2. Description of Related Art

Mechanical encoder apparatuses (a.k a., optical or incremental encoders) are extensively used in speed control and counting applications for industrial machines or assembly lines. The encoders convert shaft rotation from a master machine or process into a proportional electronic output, commonly square wave pulses, that provide an accurate means of gauging velocity and direction. In addition, some encoders also provide position output signals. The output signals from the encoder are then used to control or drive a slave device or machine. Encoders are specified as having a particular number of pulses per revolution (PPR). Specific PPR ratings are often required to correctly translate the speed of the master device or process into a desired speed for the driven or slave device.

A traditional mechanical encoder comprises a rotary shaft that is driven, for example, by a machine or assembly line whose speed or position is to be monitored. The rotary shaft includes a disk having one or more slits or apertures formed therein and spaced in an annular fashion about the disk. A light emitting device, such as a light emitting diode (LED), and a light detecting device, such as a photodiode, are positioned in alignment with one another on opposing sides of the disk. As the machine turns the rotary shaft, light is intermittently transmitted to the photodiode as the apertures are rotated into position allowing passage of the light. These light pulses received by the photodiode can then be converted into electrical waveforms and electronically processed to calculate the speed of the machine, determine the position of a machine component, increment a counter, or drive a slave device, for example.

While mechanical encoders of the type just described are useful for their intended purposes, they do have their drawbacks. As the mechanical rotary encoder is an electromechanical device, it is susceptible to failure unless properly maintained. In addition, mechanical encoders are generally used in conjunction with devices known as rate multipliers. Rate multipliers are used when the PPR of the encoder is not in the specified working range required by the position sensing device, counter, slave device, etc., and cannot be corrected by using mechanical gearing methods to obtain the proper number of revolutions. Mechanical gearing of a traditional encoder is often not feasible or desirable because of cost and/or complexity and the inherent lash and instability in any mechanical system. Moreover, existing encoders and rate multipliers do not offer the flexibility of generating a quadrature pulse train (i.e., two pulse trains in which a second pulse train is derived from a first pulse train by introducing a 90° phase shift) in which the pulse width and frequency can be precisely and easily controlled without substituting mechanical components. Such precision is particularly desirable, if not required, for applications such as servo motor control. A quadrature pulse train is preferred because it can convey direction in addition to speed information. For example, the movement direction of a machine or conveyor can be indicated by the phase shift between two signals in the quadrature pulse train.

Thus, what is sought after is a highly reliable, low maintenance electronic device that can generate a tunable, quadrature pulse train in response to an input signal representative of the speed of a machine, process, assembly line or device and can be used in place of a traditional mechanical encoder. The signals comprising the quadrature pulse train can then be used to control or drive other slave machines, processes, assembly lines or devices that use the speed and/or direction of the original machine or assembly line as a reference.

SUMMARY OF THE INVENTION

Certain objects, advantages and novel features of the invention will be set forth in the description that follows and will become apparent to those skilled in the art upon examination of the following or may be learned with the practice of the invention.

To achieve the advantages and novel features of the invention, the present invention is generally directed to an electronic encoder circuit and method for providing a quadrature pulse train whose frequency is related to the amplitude of an analog input signal. These waveforms can then be used to control other machines or processes whose speed of operation is related to the speed represented by the analog input signal. Broadly stated, the electronic encoder circuit comprises conversion circuitry that generates a digital signal from an analog signal that, in a typical application, will be representative of the speed or frequency of a machine, process, assembly line or device. The conversion circuitry is connected to a microcontroller that processes the digital signal and produces a potentially modified digital signal as an output. The output digital signal from the microcontroller is received by additional conversion circuitry that generates an encoded analog signal whose frequency is related to the original input analog signal. Phase shifting circuitry generates quadrature waveforms through operation on the encoded analog signal for controlling a slave machine, process, assembly line or device.

According to an aspect of the invention, a second microcontroller having a user interface for entering operator input is included for generating a control signal for the first microcontroller. This control signal can be used to either modify or override the digital representation of the analog input signal.

According to another aspect of the present invention, the conversion circuitry generating the encoded analog signal is tunable, thereby allowing the frequency and the duty cycles of the quadrature waveforms to be precisely controlled.

Additional advantages will become apparent from a consideration of the following description and drawings:

BRIEF DESCRIPTION OF THE DRAWINGS

Other features of the present invention will be more readily understood from the following detailed description of specific embodiments thereof when read in conjunction with the accompanying drawings, in which:

FIGS. 3A–3E are signal diagrams of the output waveforms generated by the present invention.

DESCRIPTION OF THE PREFERRED EMBODIMENT

Figure 1A:
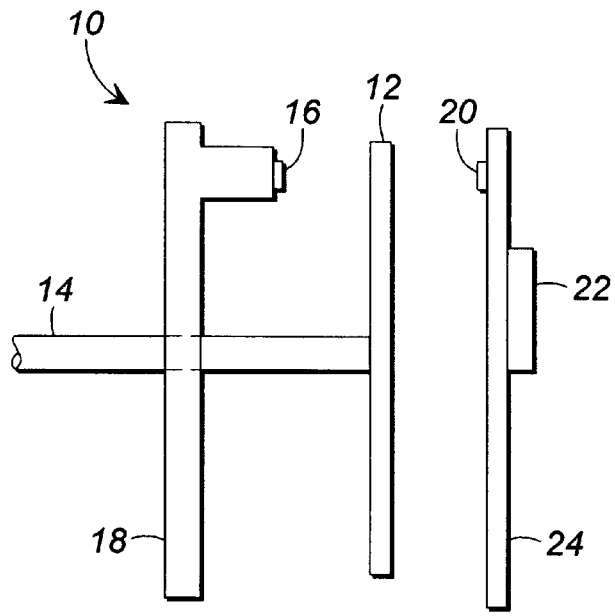
FIG. 1A is an elevation view of a prior art mechanical encoder system.

While the invention is susceptible to various modifications and alternative forms, a specific embodiment thereof is shown by way of example in the drawings and will herein be described in detail. It should be understood, however, that there is no intent to limit the invention to the particular form disclosed, but on the contrary, the invention is to cover all modifications, equivalents, and alternatives falling within the spirit and scope of the invention as defined by the claims.

Figure 1B:
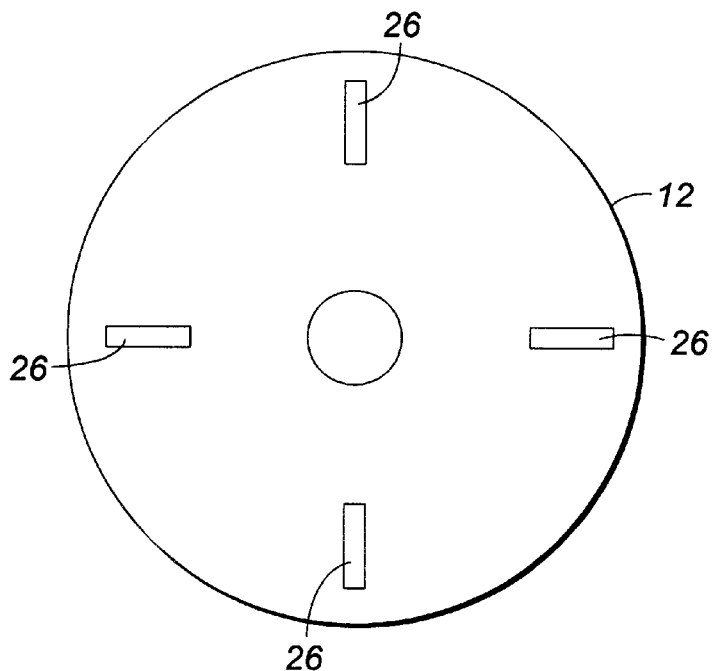
FIG. 1B is an elevation view of a disk used in prior art mechanical encoders.

An exemplary mechanical encoder that is typical of that found in the prior art is shown in FIG. 1A. Mechanical encoder 10 includes a rotary disk 12 that is fixed to a rotary shaft 14. Rotary shaft 14 is rotationally driven in response to movement by a machine (not shown). A photodiode 16 is mounted on base 18, which is positioned about rotary shaft 14. An LED 20, powered by power supply 22, is mounted on board 24 such that LED 20 and photodiode 16 are in substantial alignment. As shown in FIG. 1B, disk 12 includes apertures 26 that are positioned to bisect the optical path between LED 20 and photodiode 16.

Mechanical encoder 10 operates as follows: LED 20 projects a continuous source of light towards photodiode 16, which is successfully received whenever an aperture in disk 12 is rotated into the light path. Thus, an electrical waveform or pulse train can be generated from photodiode 16 that is a function of the configuration of apertures 26 in disk 12 and the speed by which the machine is turning rotary shaft 14. This waveform can then be electronically processed and used to drive other devices or machines that operate at a speed that is functionally related to the first machine or simply used as a counter or speed indicator for the first machine.

Figure 2:
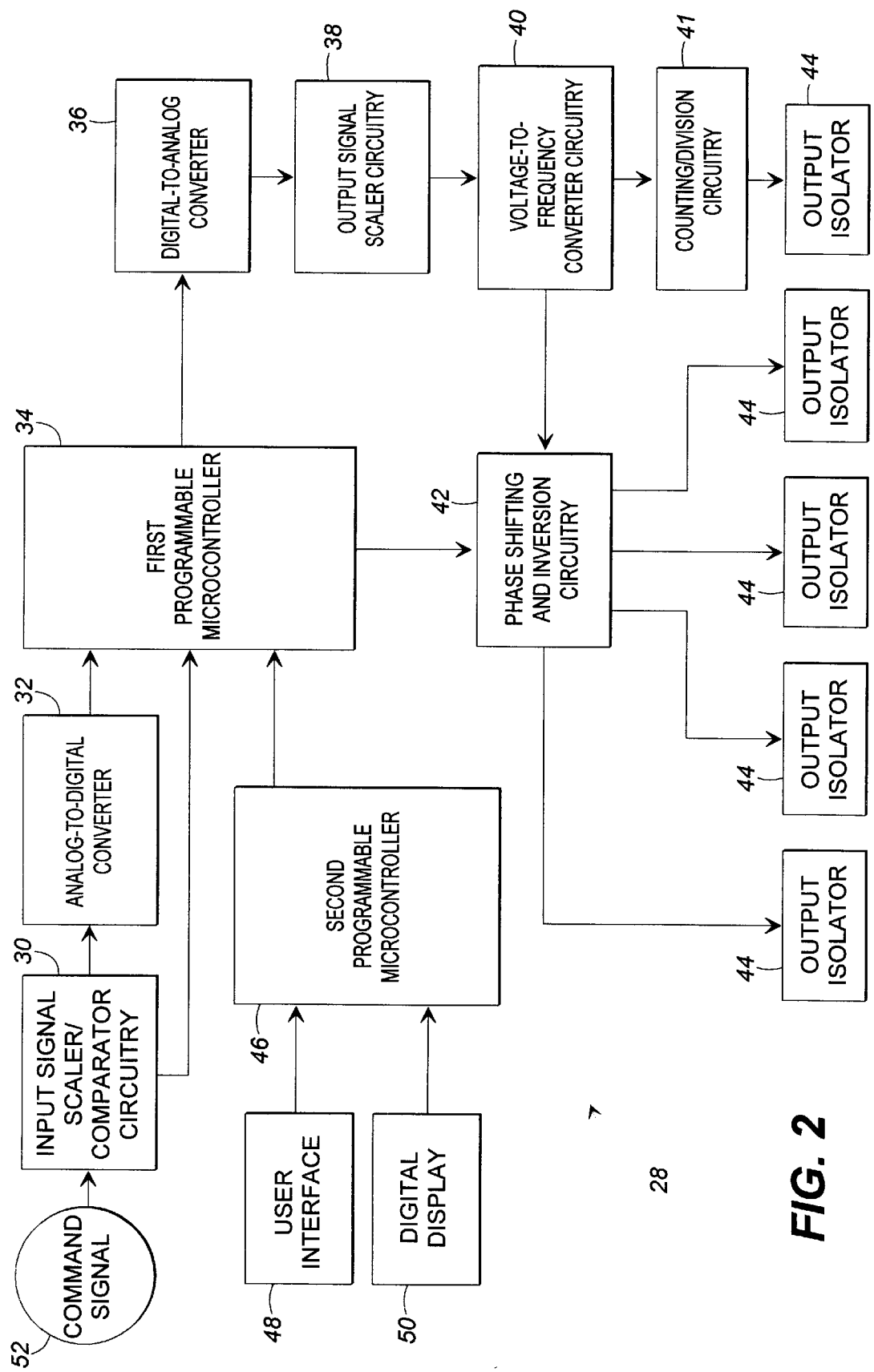
FIG. 2 is a block diagram of an exemplary electronic quadrature encoder simulator according to the present invention.

A preferred embodiment of an electronic quadrature encoder simulator 28 (hereinafter electronic encoder) that can be used in place of the traditional mechanical encoder of FIGS. 1A and 1B is shown in FIG. 2. Electronic encoder 28 comprises the following components, all electrically connected in series: input signal scaler/comparator circuitry 30; analog to digital (A/D) converter 32; first programmable microcontroller 34; digital to analog (D/A) converter 36; output signal scaler circuitry 38; voltage-to-frequency converter circuitry 40; and phase shifting/inversion circuitry 42. Counting/division circuitry 41 is also driven from the output of voltage-to-frequency converter circuitry 40. A plurality of output isolators 44 are preferably used to protect the sensitive electronic components from damage from external electrical signals. In addition, a second programmable microcontroller 46 having both a user interface 48 and digital display 50 can be included for supplying first programmable microcontroller 34 with operator initiated control signals.

The aforementioned components will be described in more detail in the following description of the operation of electrical encoder 28.

Electrical encoder 28 receives command signal 52 through input signal scaler 30. Command signal 52 is an analog signal that, in a typical industrial application, will represent the speed of a machine or assembly line. Input signal scaler 30 comprises a resistor divider network that is used to translate the possible voltage range for command signal 52 into the allowable input voltage range for analog to digital converter 32. Preferably, a potentiometer is included as part of the resistor divider network comprising input signal scaler 30 to facilitate the translation process every time a new command signal 52 from a different source is applied. Alternatively, an operational amplifier (hereinafter op amp) based circuit could be used in place of the resistor divider network to provide the proper signal translation. Op amps have the added benefit of high input impedance thus acting as a buffer to prevent loading of the command signal 52.

If direction information is to be encoded, input signal scaler 30 will include comparator circuitry that will differentiate between a positive and a negative command signal 52. The polarity of command signal 52 is conveyed by the comparator circuitry to first programmable microcontroller 34 through an I/O line for controlling the phase shift of the output quadrature waveforms. Alternatively, the polarity signal from the comparator circuitry could be provided directly to phase shifting and inversion circuitry 42 to control the phase shift between the quadrature waveforms.

A/D converter 32 will sample the now scaled version of command signal 52 and generate a digital representation of the signal for input to first programmable microcontroller 34. A/D converters are a very common electronic component and can be obtained from numerous suppliers. Two factors should be considered when choosing an A/D converter for electronic encoder 28: 1) the granularity desired in distinguishing various levels of scaled command signal 52; and 2) the sampling speed required to adequately reproduce scaled command signal 52. For most applications, command signal input 52 will be a low frequency signal eliminating the need for a high sampling rate A/D converter. However, for precise speed control, 32-bit resolution A/D converters may be preferred to achieve the desired granularity. An exemplary A/D converter that should be effective for many applications is sold by Linear Technology, Inc. 1630 McCarthy Blvd., Milpitas, Calif. 95035-7417 under part number LTC1298. The LTC1298 provides 12-bit resolution and a sampling rate of 11.1 ksps.

First programmable microcontroller 34 receives digitized samples of scaled command signal 52 and processes these samples according to a program stored in its memory. For example, it may be desired to generate pulse trains whose frequencies are related to the speed represented by command signal 52 by a transfer function. This transfer function can be programmed into microcontroller 34 to generate modified samples for D/A converter 36. Frequently, the transfer function applied to the samples by microcontroller 34 will be either amplification or attenuation by a given percentage or addition or subtraction of a fixed offset.

Optionally, second programmable microcontroller 46 can be used to receive control input from an operator through user interface 48. Digital display 50 provides a visual representation of the data entered by the operator. With this arrangement, the operator is provided with a keypad as user interface 48 in which buttons are allocated for increasing or decreasing the frequency of the output pulse trains. In addition, the operator can also enter an absolute set point that would override the digitized samples of scaled command signal 52. User interface 48 is also used to input on/off signals for electrical encoder 28. Microcontroller 34, being in communication with microcontroller 46, is programmed to apply the control information received from microcontroller 46 as a transfer function on the digital samples.

In the preferred embodiment, microcontroller 34 is a Basic Stamp I computer and microcontroller 46 is a Basic Stamp II computer sold by Parallax, Inc., 3805 Atherton Rd., Suite 102, Rocklin, Calif. 95765. The two computers are essentially the same except for their speed, memory size and number of I/O pins available. The Basic Stamps run Parallax BASIC (PBASIC) out of an EEPROM, which provides great flexibility in reprogramming microcontrollers 34 and 46 for new applications of electronic encoder 28. Moreover, PBASIC is an interpreted language similar to BASIC and thus requires no compilation. Communication between microcontroller 46 and microcontroller 34 is straightforward as I/O pins between the two computers can be directly connected to transfer information. Finally, the BASIC Stamp computers are inexpensive and provide just enough computational power to control the instant invention.

After the digitized samples of scaled command signal 52 have been processed by first programmable microcontroller 34, they are then converted back into an analog signal by D/A converter 36. D/A converter 36 should be chosen to complement A/D converter 32. That is, it should be able to convert digital samples having the same bit resolution as that generated by A/D converter 32. An exemplary D/A converter that can be used in conjunction with the LTC1298 A/D converter discussed hereinbefore is the MAX531 serial 12-bit D/A converter sold by Maxim Integrated Products, 120 San Gabriel Drive, Sunnyvale, Calif. 94086.

The output analog signal from D/A converter 36 represents a new speed or frequency that is based on the original speed or frequency represented by command signal input 52. Of course, if the digital samples of command signal 52 were passed through first programmable microcontroller 34 without modification, the signal emerging from D/A converter 36 should be equivalent to the scaled version of command signal 52 exiting input signal scaler 30. The output analog signal from D/A converter 36 is then scaled via output signal scaler 38, which, comprises a resistor network that is used to control the operation of voltage-to-frequency converter 40. As discussed hereinbefore with reference to input signal scaler/comparator circuitry 30, an op amp based circuit can be used in place of the resistor divider network to minimize the loading effects on the output analog signal from D/A converter 36. The operation of voltage-to-frequency converter 40 and the role of output signal scaler 38 is best understood by way of a specific example.

An exemplary voltage-to-frequency converter for use in the present invention is the ADVFC32 sold by Analog Devices, Inc., One Technology Way, P.O. Box 9106, Norwood, Mass. 02062-9106. This device will generate a square wave signal as shown in FIG. 3A according to equations 1 and 2 set forth below:

$$t_1 \approx (C_1 + 44pF) * 6.7 \text{ k}\Omega \quad \text{(Eq. 1)}$$

$$F_{out} = V_{in}/(R_{in} * 1 \text{ mA} * t_1) \quad \text{(Eq. 2)}$$

For the ADVFC32 device, $R_{in}$ should be chosen such that $V_{in}/R_{in}$ is less than or equal to 0.25 mA when $V_{in}$ is at its maximum value. Thus, output signal scaler 38 will preferably include a potentiometer for use as $R_{in}$ to adjust the current input to voltage-to-frequency converter 40 when the output signal ($V_{in}$) from D/A converter 36 is at its maximum value. A variable capacitor $C_1$ is appropriately connected to voltage to frequency converter 40 to control the duty cycle time $t_1$. The output voltage level $V_{out}$ of the signal in FIG. 3A is set to a desired level through a pull-up resistor connected to voltage-to-frequency. converter 40. This will generally be +5 V for driving CMOS or TTL based phase shifting and inversion circuitry 42.

Thus it should be appreciated that the signal depicted in FIG. 3A is an encoded analog signal whose frequency ($F_{out}$) is related to the speed or frequency represented by command signal input 52 as modified by first programmable microcontroller 34. The frequency can be further adjusted by selective tuning of resistor $R_{in}$ and capacitor $C_1$. In addition to the frequency, the duty cycle of the encoded signal depicted in FIG. 3A can also be adjusted by tuning capacitor $C_1$.

As discussed hereinbefore, prior art rate multipliers in conjunction with mechanical encoders have been ineffective in generating a quadrature pulse train in which the frequency and duty cycle can be precisely and easily controlled without substituting mechanical components. The present invention overcomes this shortcoming through the tuning capability provided by voltage-to-frequency converter circuitry 40 and via phase shifting and inversion circuitry 42. Both the frequency and the duty cycle of the encoded output signal from voltage-to-frequency converter 40 can be controlled as depicted in FIG. 3A through tuning of common electronic components as discussed in the foregoing. This signal serves as one of the quadrature output signals. The other quadrature output signal is created by phase shifting the signal in FIG. 3A through use of J–K or type D flip flops to generate the signal shown in FIG. 3C. The phase difference between the signals of FIGS. 3A and 3C is used to convey direction information. As shown, the signal depicted in FIG. 3A leads the signal depicted in FIG. 3B by 90°. This is determined by using the following convention: if the signal of FIG. 3C is low during a low to high transition of the signal of FIG. 3A, then the signal of FIG. 3A leads the signal of FIG. 3B; conversely, if the signal of FIG. 3C is high during a low to high transition of the signal of FIG. 3A, then the signal of FIG. 3A lags the signal of FIG. 3C. Clearly, any suitable convention can be chosen to establish the phase relationship between the two signals.

To transmit the direction information to the output, phase shifting and inversion circuitry 42 includes a switch that is driven by an output signal from first programmable microcontroller 34, or, alternatively, directly from input signal scaler/comparator circuitry 30, to swap the signals of FIGS. 3A and 3C on the output lines according to the direction represented by the polarity of command signal 52. For example, the master machine or device may be rotating in a clockwise direction, which would be represented by a positive command signal 52. Clockwise rotation is represented by the signal of FIG. 3A leading the signal of FIG. 3C. Accordingly, first programmable microcontroller 34, having received the positive polarity information from input signal scaler/comparator circuitry 30, signals phase shifting and inversion circuitry 42 to switch the signal of FIG. 3A to a first output line and the signal of FIG. 3C to a second output line. Conversely, if a negative command signal 52 is applied representing counter-clockwise rotation, first programmable microcontroller signals phase shifting and inversion circuitry 42 to switch the signal of FIG. 3C to the first output line and the signal of FIG. 3A to the second output line.

The signals depicted in FIGS. 3B and 3D are generated by simply inverting the FIGS. 3A and 3C signals respectively. In place of inverters, differential line driver circuits can also be used as they take an input signal and reproduce the input signal and its complement as an output. These inverted or complementary signals are used to generate another output signal by subtracting the inverted signal (e.g., FIG. 3B) from the original signal (e.g., FIG. 3A) and then level shifting. Subtracting the two signals is designed to reduce or eliminate a common noise component affecting both signals.

The use of flip flops, inverters and differential line drivers for phase shifting and inversion circuitry 42 is discussed herein as the preferred embodiment because of their simplicity and low cost. It will be appreciated by those skilled in the art that alternative circuitry can be substituted by the skilled practitioner to perform the desired phase shifting and inversion without departing from the spirit of the present invention.

A fifth signal depicted in FIG. 3E is commonly referred to as an index signal, zero reference signal or zero marker signal. This signal is defined by one pulse per encoder revolution and is used to identify a home or reset position for the master machine or device. From the example shown in FIGS. 3A and 3E, it should be clear that the encoder being simulated is a two PPR encoder as one cycle of the zero marker signal (FIG. 3E) spans two cycles of the encoded signal (FIG. 3A). The zero marker signal of FIG. 3E is generated by taking the encoded output signal from voltage-to-frequency converter circuitry 40 and using that signal to drive counter/division circuitry 41. Counter/division circuitry 41 can be a microcontroller or a simple counter. Jumper wires or dip switches can be used to access the appropriate bit in the counter to divide the encoded output signal by the PPR to create the zero marker signal of FIG. 3E.

The present invention will often be used in industrial settings to provide control signals for heavy machinery. Accordingly, external access to each output signal portrayed in FIGS. 3A–3E is preferably provided through an output isolator 44 such as an optoisolator. Optoisolators, which are available from a variety of manufacturers, protect the delicate electronic circuitry from the high voltage, high noise environments associated with large scale electric machinery applications through use of photodiodes and LEDs. The output signals from output isolators 44 can now be used, for example, to control the speed or operation of other machines, assembly lines or processes that use the original machine whose speed is represented by command signal input 52 as a reference.

The principles of the invention have been illustrated herein as they are applied to an electronic encoder circuit. From the foregoing, it can readily be seen that the electronic encoder circuit described herein provides a set of quadrature waveforms whose frequency is related to the amplitude of an analog input signal. Advantageously, the frequency of the quadrature waveforms can be tuned electronically without incorporating any mechanical components. These quadrature waveforms can then be used to control other machines or processes whose speed of operation is related to the speed represented by the analog input signal. Moreover, the operator, through a keypad interface supported by a small microcontroller, can increase or decrease the quadrature waveform frequency or enter an absolute frequency value in real time. In addition, the encoder circuit can be tuned using common electronic components to adapt the duty cycles of the quadrature waveforms to a given application. Such tuning capability provides the electronic encoder according to the instant invention a degree of precision not available from prior art mechanical encoders and rate multipliers without substituting mechanical components, which can be cumbersome and sometimes costly. Lastly, the electronic encoder is comprised entirely of readily available electronic components and, therefore, is not as susceptible to breakdown as prior art mechanical encoders.

In concluding the detailed description, it should be noted that it will be obvious to those skilled in the art that many variations and modifications can be made to the preferred embodiment without substantially departing from the principles of the present invention. All such variations and modifications are intended to be included herein within the scope of the present invention, as set forth in the following claims. Further, in the claims hereafter, the corresponding structures, materials, acts, and equivalents of all means or step plus function elements are intended to include any structure, material, or acts for performing the functions with other claimed elements as specifically claimed.

I claim:

1. An electronic quadrature encoder simulator, comprising:

first conversion means receptive to an analog signal and generating a first digital signal in response thereto, said analog signal representative of a first frequency;

first processing means receiving said first digital signal as an input and generating a second digital signal as an output;

second conversion means receiving said second digital signal and generating an encoded signal having a second frequency that is a function of said first frequency;

phase shifting means receiving said encoded signal and generating quadrature output signals therefrom.

2. The electronic quadrature encoder simulator of claim 1, wherein said first conversion means comprises signal scaling circuitry in series with an analog-to-digital converter.

3. The electronic quadrature encoder simulator of claim 2, wherein said signal scaling circuitry comprises a resistor network.

4. The electronic quadrature encoder simulator of claim 2, wherein said signal scaling circuitry comprises an op amp circuit.

5. The electronic quadrature encoder simulator of claim 2, wherein said analog signal carries direction information and said first conversion means further comprises comparator circuitry detecting said direction information.

6. The electronic quadrature encoder simulator of claim 5, wherein said phase shifting means comprises switching circuitry responsive to said direction information detected by said comparator circuitry for controlling the phase difference between said quadrature output signals.

7. The electronic quadrature encoder simulator of claim 1, wherein said first processing means is a programmable microcontroller.

8. The electronic quadrature encoder simulator of claim 7, wherein said programmable microcontroller contains a memory device having a program defining a transfer function for generating said second digital signal from said first digital signal.

9. The electronic quadrature encoder simulator of claim 1, wherein said second conversion means comprises a digital-to-analog converter, signal scaling circuitry, and voltage-to-frequency converter circuitry in series.

10. The electronic quadrature encoder simulator of claim 9, wherein said signal scaling circuitry comprises a resistor network.

11. The electronic encoder of claim 9, wherein said signal scaling circuitry comprises an op amp circuit.

12. The electronic quadrature encoder simulator of claim 9, wherein the frequency and duty cycle of said quadrature output signals are adjustable through tuning said signal scaling circuitry and said voltage to frequency converter circuitry.

13. The electronic quadrature encoder simulator of claim 1, wherein said phase shifting means comprises a plurality of flip-flops.

14. The electronic quadrature encoder simulator of claim 1, further comprising:

division means receiving said encoded signal and generating a zero marker signal therefrom.

15. The electronic quadrature encoder simulator of claim 14, wherein said division means is a counting circuit.

16. The electronic quadrature encoder simulator of claim 1, further comprising output circuitry providing electrical isolation between said quadrature output signals and the external environment.

17. The electronic quadrature encoder simulator of claim 16, wherein said output circuitry is a plurality of optoisolators.

18. The electronic quadrature encoder simulator of claim 1, further comprising:

second processor means in communication with said first processor means and providing said first processor means with a control signal.

19. The electronic quadrature encoder simulator of claim 18, wherein said second digital signal is a function of said first digital signal and said control signal.

20. The electronic quadrature encoder simulator of claim 18, wherein said second digital signal is a function of said control signal.

21. A method for generating a set of quadrature waveforms, comprising:

providing a first analog signal representing a first frequency;

converting said first analog signal into a first digital signal;

processing said first digital signal to generate a second digital signal;

converting said second digital signal into an encoded analog signal having a second frequency that is a function of said first frequency; and generating quadrature output signals from said encoded analog signal.

22. The method of claim 21, wherein said converting said first analog signal step comprises the steps of:

scaling said first analog signal; and sampling said first analog signal with an analog-to-digital converter.

23. The method of claim 21, wherein said converting said second digital signal step comprises the steps of:

generating a second analog signal from said second digital signal via a digital-to-analog converter;

scaling said second analog signal; and generating an encoded analog signal from said second analog signal via voltage-to-frequency converter circuitry.

24. The method of claim 21, wherein said generating step comprises:

phase shifting said encoded analog signal.

25. The method of claim 24, wherein said first analog signal carries direction information and further comprising the step of detecting said direction information.

26. The method of claim 25, further comprising the step of:

controlling the phase difference between said quadrature output signals based on said direction information.

27. The method of claim 21, further comprising the step of:

generating a zero marker signal from said encoded analog signal.

28. The method of claim 21, further comprising:

providing a control signal containing operator information.

29. The method of claim 28, wherein said processing step comprises:

processing said first digital signal based on said control signal information.

30. The method of claim 28, wherein said processing step comprises:

overriding said first digital signal with said control signal.

* * * * *